United States Patent
Kajiyama et al.

(10) Patent No.: US 8,081,505 B2
(45) Date of Patent: Dec. 20, 2011

(54) MAGNETORESISTIVE ELEMENT AND METHOD OF MANUFACTURING THE SAME

(75) Inventors: Takeshi Kajiyama, Yokohama (JP);
Yoshiaki Asao, Sagamihara (JP);
Shigeki Takahashi, Yokohama (JP);
Minoru Amano, Sagamihara (JP);
Kuniaki Sugiura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 12/556,389

(22) Filed: Sep. 9, 2009

(65) Prior Publication Data
US 2010/0102407 A1    Apr. 29, 2010

(30) Foreign Application Priority Data
Oct. 23, 2008 (JP) ................. 2008-273276

(51) Int. Cl.
*H01L 29/82* (2006.01)
(52) U.S. Cl. .. 365/158; 257/108; 257/421; 257/E29.323
(58) Field of Classification Search .............. 257/108, 257/421, E29.323; 365/157, 158
See application file for complete search history.

(56) References Cited

U.S. PATENT DOCUMENTS

| | | | |
|---|---|---|---|
| 6,713,802 B1 * | 3/2004 | Lee | 257/295 |
| 6,998,665 B2 * | 2/2006 | Motoyoshi | 257/300 |
| 7,186,569 B2 * | 3/2007 | Rinerson et al. | 438/3 |
| 7,372,118 B2 * | 5/2008 | Asao et al. | 257/421 |
| 7,935,542 B2 * | 5/2011 | Murata et al. | 438/3 |
| 2004/0137681 A1 | 7/2004 | Motoyoshi | |
| 2005/0280040 A1 * | 12/2005 | Kasko et al. | 257/213 |
| 2008/0191252 A1 * | 8/2008 | Nakamura et al. | 257/295 |
| 2009/0269860 A1 * | 10/2009 | Murata et al. | 438/3 |

FOREIGN PATENT DOCUMENTS
JP   2003-243630   8/2003

OTHER PUBLICATIONS

Explanation of Non-English Language References in 2 pages. Signed May 13, 2009, filed Sep. 9, 2009.

* cited by examiner

*Primary Examiner* — Allan R Wilson
(74) *Attorney, Agent, or Firm* — Knobbe Martens Olson & Bear LLP

(57) ABSTRACT

A magnetoresistive element includes a stacked structure including a fixed layer having a fixed direction of magnetization, a recording layer having a variable direction of magnetization, and a nonmagnetic layer sandwiched between the fixed layer and the recording layer, a first protective film covering a circumferential surface of the stacked structure, and made of silicon nitride, and a second protective film covering a circumferential surface of the first protective film, and made of silicon nitride. A hydrogen content in the first protective film is not more than 4 at %, and a hydrogen content in the second protective film is not less than 6 at %.

5 Claims, 7 Drawing Sheets

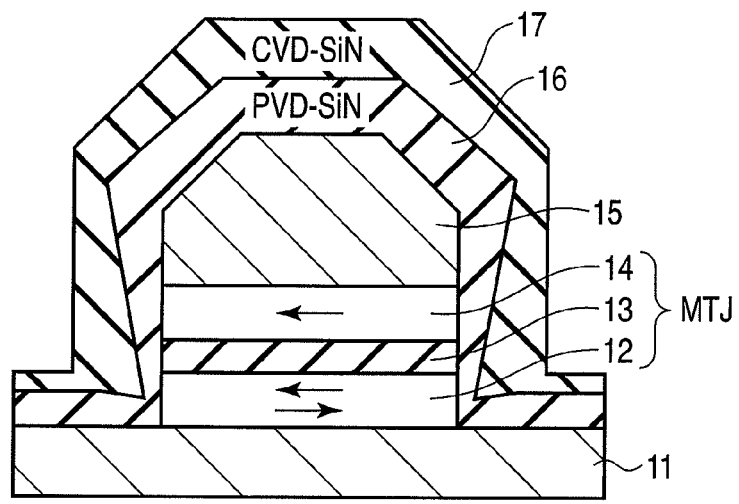
F I G. 1
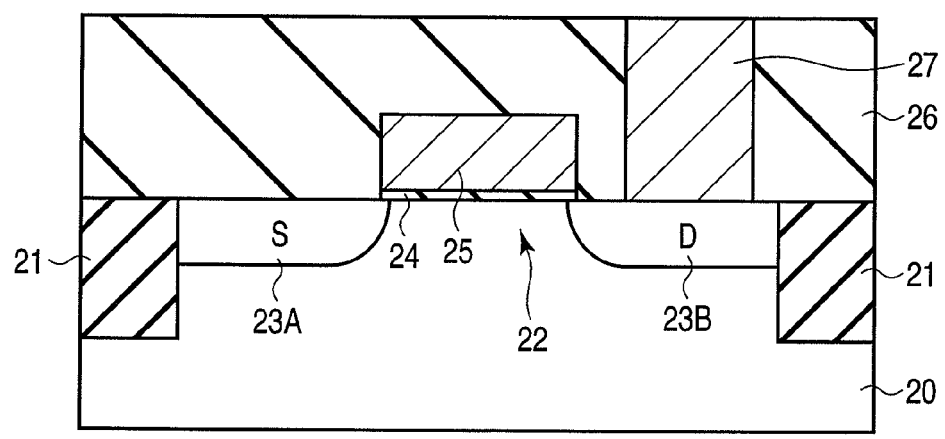
F I G. 2

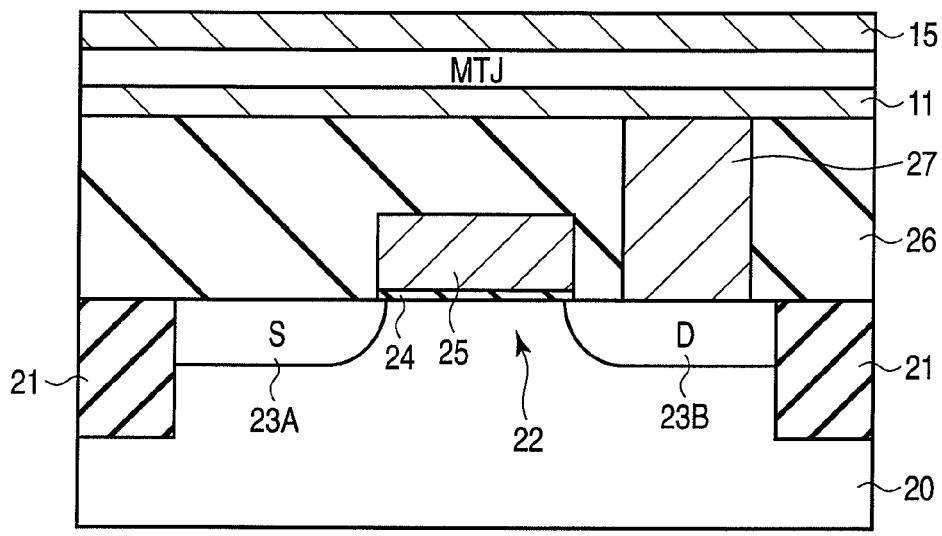
F I G. 3
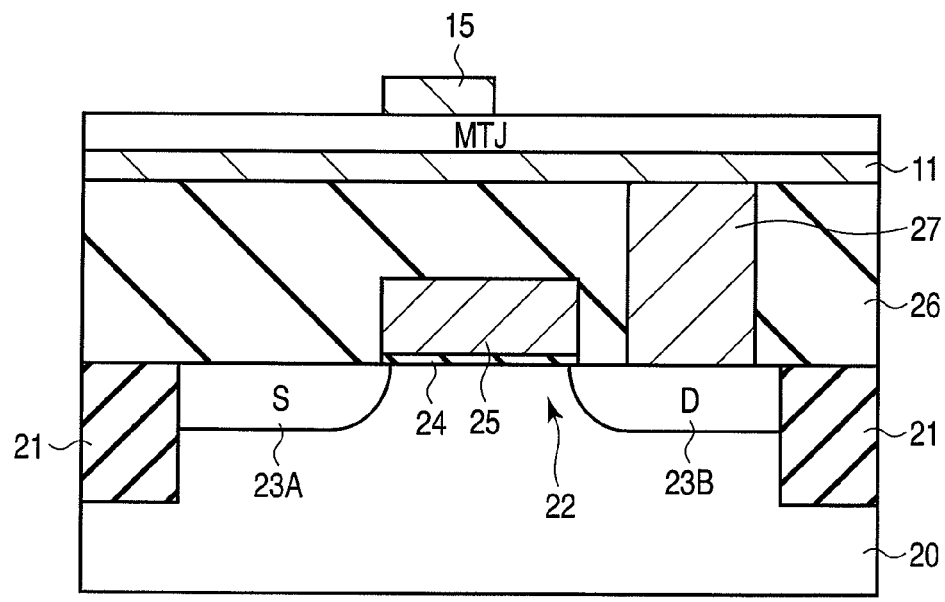
F I G. 4

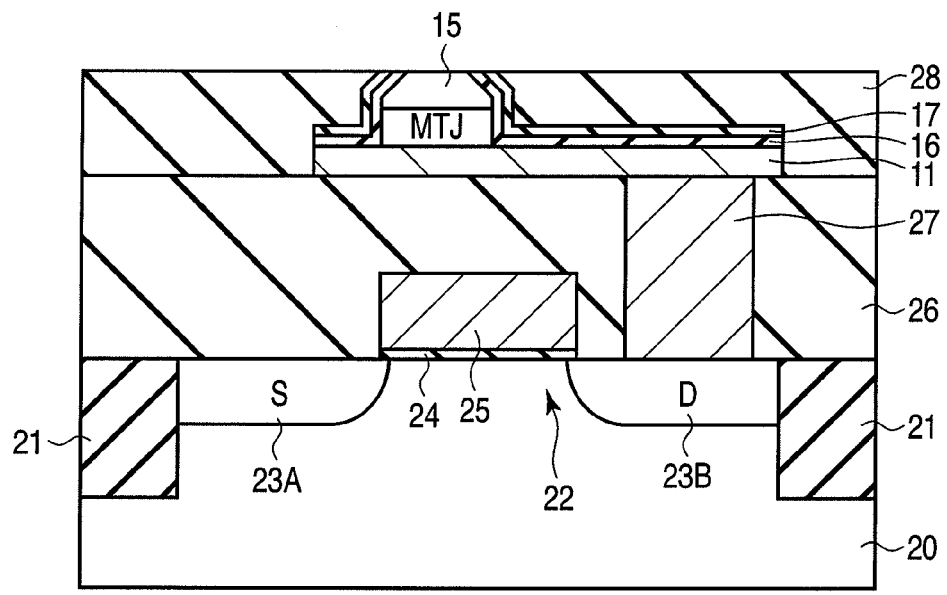
F I G. 9
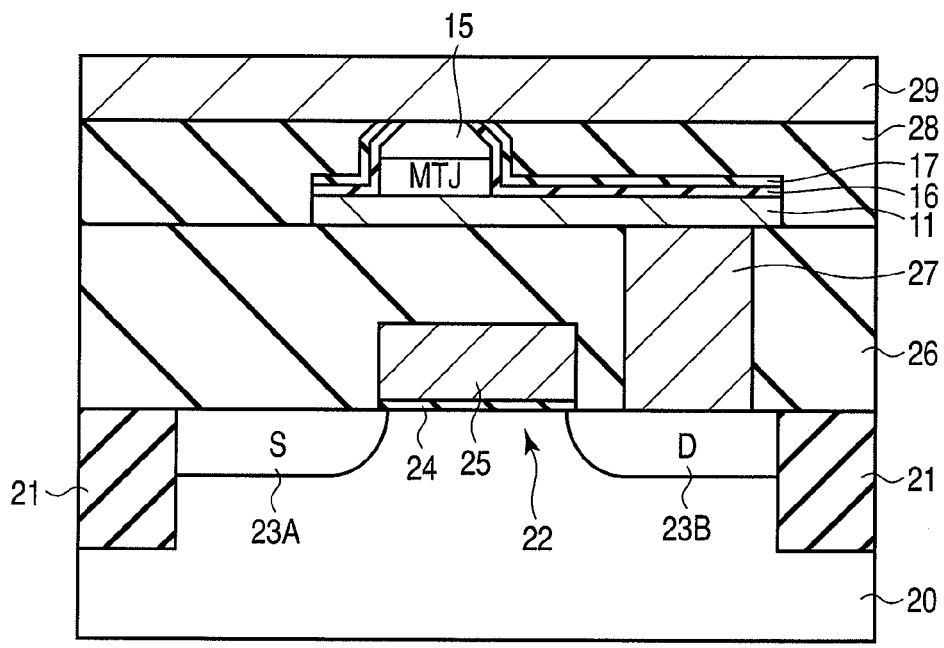
F I G. 10

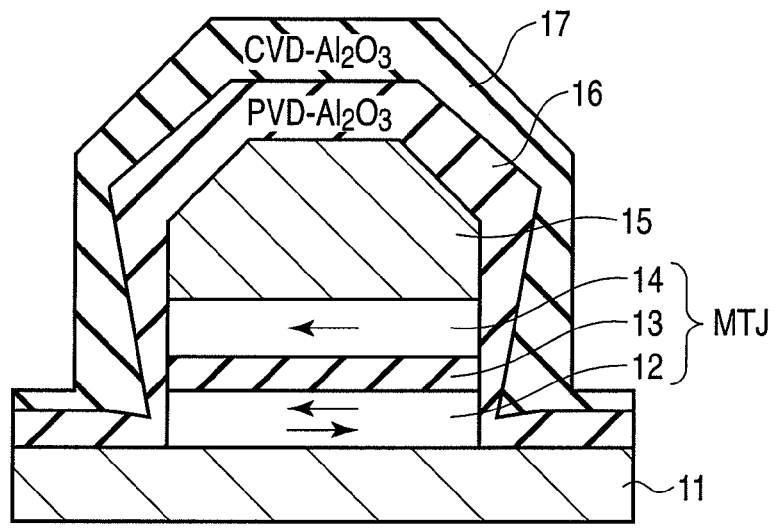
F I G. 11
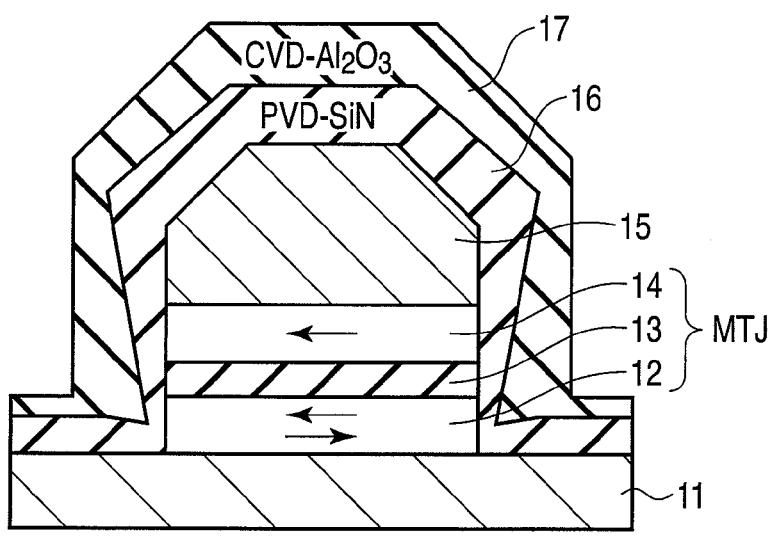
F I G. 12

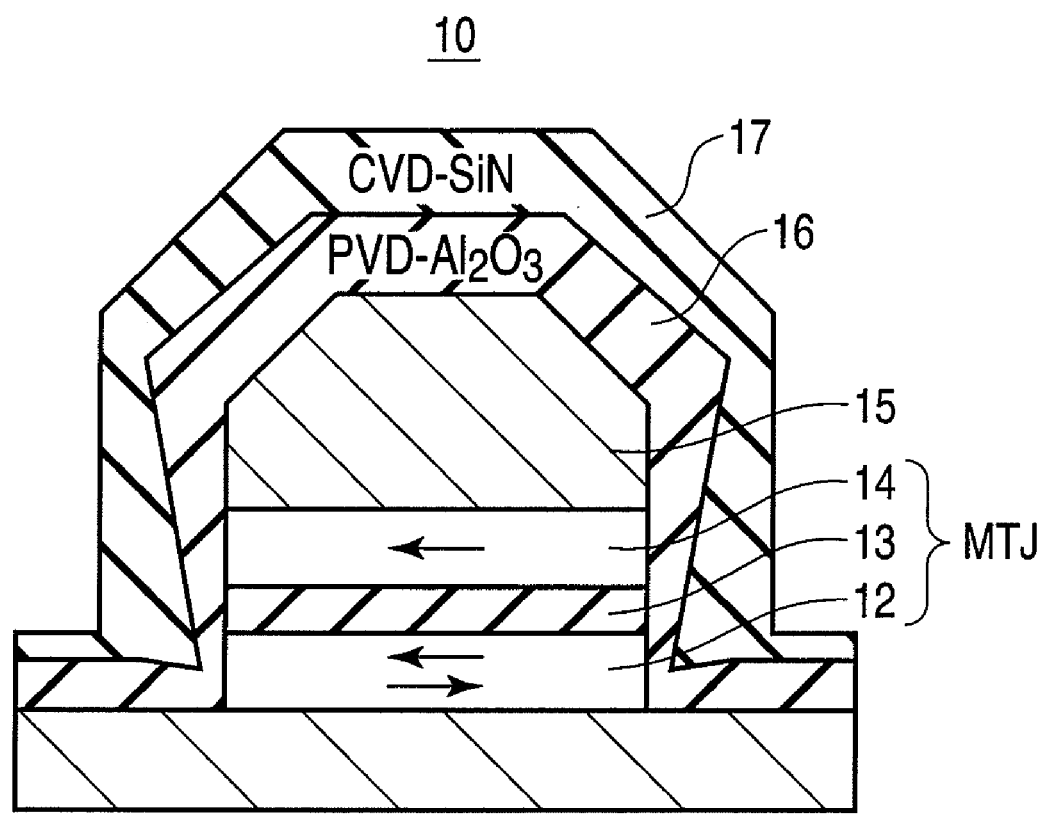
F I G. 13

MAGNETORESISTIVE ELEMENT AND METHOD OF MANUFACTURING THE SAME

CROSS-REFERENCE TO RELATED APPLICATIONS

This application is based upon and claims the benefit of priority from prior Japanese Patent Application No. 2008-273276, filed Oct. 23, 2008, the entire contents of which are incorporated herein by reference.

BACKGROUND OF THE INVENTION

1. Field of the Invention

The present invention relates to a magnetoresistive element and a method of manufacturing the same, e.g., a magnetoresistive element capable of recording data by bidirectionally supplying an electric current, and a method of manufacturing the same.

2. Description of the Related Art

A magnetic random access memory (MRAM) is known as a kind of a semiconductor memory. The MRAM is a device that performs a memory operation by storing binary 1 or 0 in a memory cell by using the magnetoresistive effect. Since the MRAM is a nonvolatile, high-speed, high-integration, high-reliability device, it is regarded as a candidate for a memory device capable of replacing, e.g., an SRAM, pseudo-SRAM (PSRAM), or DRAM.

Many MRAMs using an element exhibiting the tunneling magnetoresistive (TMR) effect among the magnetoresistive effects have been reported. As the TMR effect element, a magnetic tunnel junction (MTJ) element is generally used. This MTJ element has a stacked structure including two ferromagnetic layers and a tunnel barrier layer sandwiched between them, and uses a magnetoresistance change obtained by the spin-polarized tunneling effect. The MTJ element can take a low-resistance state and high-resistance state in accordance with the magnetization arrangement of the two ferromagnetic layers. A binary digit can be recorded in the MTJ element by defining the low-resistance state as binary 0 and the high-resistance state as binary 1.

An interlayer dielectric film is normally formed around the MTJ element. Oxygen contained in this interlayer dielectric film or a gas produced when the interlayer dielectric film is formed degrades the characteristics of the magnetic layers and tunnel barrier layer forming the MTJ element. This degrades the magnetic characteristics of the MTJ element, and consequently destroys the retained binary digit.

As a related technique of this kind, a technique that suppresses oxidation or reduction of a tunnel insulating layer by covering the circumferential surface of the MTJ element with a barrier layer has been disclosed (Jpn. Pat. Appln. KOKAI Publication No. 2003-243630).

BRIEF SUMMARY OF THE INVENTION

According to an aspect of the present invention, there is provided a magnetoresistive element comprising: a stacked structure including a fixed layer having a fixed direction of magnetization, a recording layer having a variable direction of magnetization, and a nonmagnetic layer sandwiched between the fixed layer and the recording layer; a first protective film covering a circumferential surface of the stacked structure, and made of silicon nitride; and a second protective film covering a circumferential surface of the first protective film, and made of silicon nitride, wherein a hydrogen content in the first protective film is not more than 4 at %, and a hydrogen content in the second protective film is not less than 6 at %.

According to an aspect of the present invention, there is provided a magnetoresistive element comprising: a stacked structure including a fixed layer having a fixed direction of magnetization, a recording layer having a variable direction of magnetization, and a nonmagnetic layer sandwiched between the fixed layer and the recording layer; a first protective film covering a circumferential surface of the stacked structure, and made of aluminum oxide; and a second protective film covering a circumferential surface of the first protective film, and made of aluminum oxide, wherein a hydrogen content in the first protective film is not more than 4 at %, and a hydrogen content in the second protective film is not less than 6 at %.

According to an aspect of the present invention, there is provided a magnetoresistive element comprising: a stacked structure including a fixed layer having a fixed direction of magnetization, a recording layer having a variable direction of magnetization, and a nonmagnetic layer sandwiched between the fixed layer and the recording layer; a first protective film covering a circumferential surface of the stacked structure; and a second protective film covering a circumferential surface of the first protective film, wherein one of the first protective film and the second protective film is made of silicon nitride, and the other is made of aluminum oxide, a hydrogen content in the first protective film is not more than 4 at %, and a hydrogen content in the second protective film is not less than 6 at %.

According to an aspect of the present invention, there is provided a magnetoresistive element manufacturing method comprising: forming a stacked structure including a fixed layer having a fixed direction of magnetization, a recording layer having a variable direction of magnetization, and a nonmagnetic layer sandwiched between the fixed layer and the recording layer; forming a first protective film made of silicon nitride by using PVD to cover a circumferential surface of the stacked structure; and forming a second protective film made of silicon nitride by using CVD to cover a circumferential surface of the first protective film.

BRIEF DESCRIPTION OF THE SEVERAL VIEWS OF THE DRAWING

FIG. 1 is a sectional view showing the arrangement of an MTJ element 10 according to the first embodiment of the present invention;

FIG. 2 is a sectional view showing a step of a method of manufacturing an MRAM including the MTJ element 10;

FIG. 3 is a sectional view showing a step, which follows FIG. 2, of the MRAM manufacturing method;

FIG. 4 is a sectional view showing a step, which follows FIG. 3, of the MRAM manufacturing method;

FIG. 9 is a sectional view showing a step, which follows FIG. 8, of the MRAM manufacturing method;

FIG. 10 is a sectional view showing a step, which follows FIG. 9, of the MRAM manufacturing method;

FIG. 11 is a sectional view showing the arrangement of an MTJ element 10 according to the second embodiment of the present invention;

FIG. 12 is a sectional view showing the arrangement of an MTJ element 10 according to the third embodiment of the present invention; and FIG. 13 is a sectional view showing another example of the arrangement of the MTJ element 10 according to the third embodiment.

DETAILED DESCRIPTION OF THE INVENTION

Figure 5:
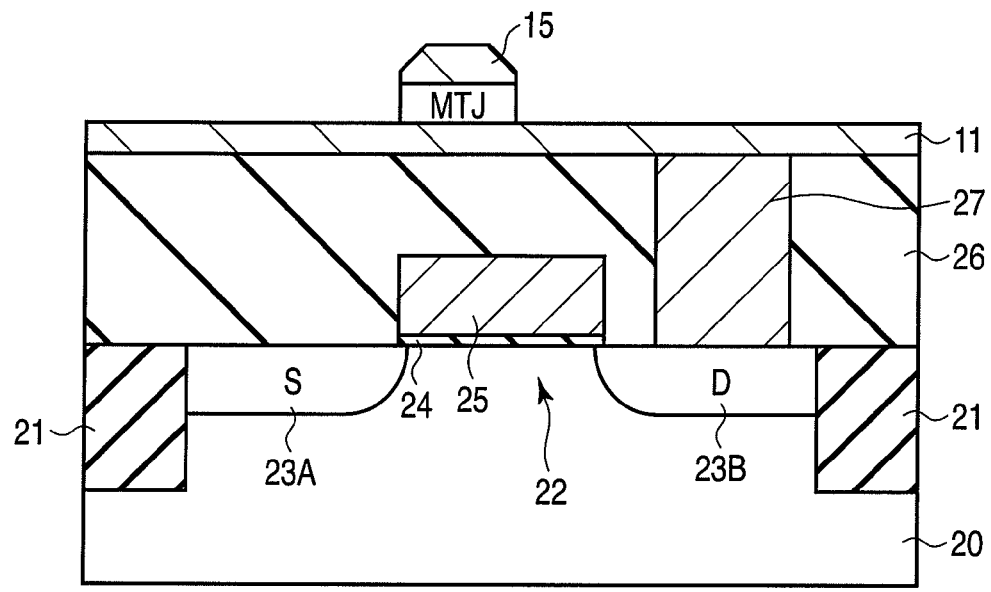
FIG. 5 is a sectional view showing a step, which follows FIG. 4, of the MRAM manufacturing method.

The embodiments of the present invention will be described hereinafter with reference to the accompanying drawings. In the description which follows, the same or functionally equivalent elements are denoted by the same reference numerals, to thereby simplify the description.

First Embodiment

FIG. 1 is a sectional view showing the arrangement of a magnetoresistive element (MTJ element) 10 according to the first embodiment of the present invention. The MTJ element 10 is a memory element that stores a binary digit in accordance with the relative directions of magnetization of two magnetic layers included in the element. Arrows in FIG. 1 indicate the directions of magnetization.

The MTJ element 10 has a stacked structure obtained by sequentially stacking a lower electrode 11, a recording layer (also called a free layer) 12, a nonmagnetic layer (tunnel barrier layer) 13, a fixed layer (also called a reference layer) 14, and an upper electrode 15. In the following explanation, a portion including the recording layer 12, tunnel barrier layer 13, and fixed layer 14 will be simply referred to as an MTJ. The upper electrode 15 also functions as a hard mask layer. Note that the positions of the recording layer 12 and fixed layer 14 may also be switched.

In the recording layer 12, the direction of magnetization (or spin) is variable (reverses). In the fixed layer 14, the direction of magnetization is invariable (fixed). "The direction of magnetization in the fixed layer 14 is invariable" means that the direction of magnetization in the fixed layer 14 does not change when a magnetization reversing current to be used to reverse the direction of magnetization in the recording layer 12 is supplied to the fixed layer 14. In the MTJ element 10, therefore, a magnetic layer having a large reversing current is used as the fixed layer 14, and a magnetic layer having a reversing current smaller than that in the fixed layer 14 is used as the recording layer 12. This makes it possible to implement the MTJ element 10 including the recording layer 12 having a variable direction of magnetization and the fixed layer 14 having an invariable direction of magnetization. When reversing magnetization by spin-polarized electrons, the reversing current is proportional to the attenuation constant, anisotropic magnetic field, and volume. Therefore, a difference can be produced between the reversing currents of the recording layer 12 and fixed layer 14 by appropriately adjusting these parameters. Also, the direction of magnetization in the fixed layer 14 can be fixed by forming an antiferromagnetic layer (not shown) on the fixed layer 14.

The easy directions of magnetization in the recording layer 12 and fixed layer 14 can be perpendicular to the film surface (or the stacked layer surface) (this magnetization will be referred to as perpendicular magnetization hereinafter), or parallel to the film surface (this magnetization will be referred to as in-plane magnetization hereinafter). A perpendicular magnetization magnetic layer has magnetic anisotropy perpendicular to the film surface. An in-plane magnetization magnetic layer has magnetic anisotropy in the direction of a plane.

The planar shape of the MTJ element 10 is not particularly limited, and can be any of, e.g., a circle, ellipse, square, and rectangle. The planar shape may also be a square or rectangle having rounded or beveled corners.

The materials of the MTJ element 10 will now be explained. The recording layer 12 and fixed layer 14 consist of a magnetic material having a high coercive force. More specifically, this magnetic material preferably has a high magnetic anisotropic energy density of $1 \times 10^6$ erg/cc or more. Material examples (1-1) to (1-3) will be explained below.

(1-1) An alloy containing at least one of iron (Fe), cobalt (Co), and nickel (Ni), and at least one of chromium (Cr), platinum (Pt), and palladium (Pd).

Examples of an ordered alloy are $Fe_{50}Pt_{50}$, $Fe_{50}Pd_{50}$, and $CO_{50}Pt_{50}$. The unit of each numerical value of the compositions is at %. Examples of a random alloy are a CoCr alloy, CoPt alloy, CoCrPt alloy, CoCrPtTa alloy, and CoCrNb alloy.

(1-2) A material obtained by alternately stacking at least one of iron (Fe), cobalt (Co), and nickel (Ni) or an alloy containing one of these elements, and one of platinum (Pt) and palladium (Pd) or an alloy containing one of these elements.

Examples are a Co/Pt artificial lattice, Co/Pd artificial lattice, and CoCr/Pt artificial lattice. When using the CoPt artificial lattice and Co/Pd artificial lattice, a high magnetoresistance change ratio (MR ratio) of about 40% can be achieved.

(1-3) An amorphous alloy containing at least one rare-earth metal, e.g., terbium (Tb), dysprosium (Dy), or gadolinium (Gd), and at least one transition metal.

Examples are a TbFe alloy, TbCo alloy, TbFeCo alloy, DyTbFeCo alloy, and GdTbCo alloy.

Although the recording layer 12 can consist of the magnetic material having a high coercive force as described above, the recording layer 12 may also consist of a magnetic material having a magnetic anisotropic energy density lower than that of the above-mentioned magnetic material having a high coercive force by adjusting the composition ratio, adding an impurity, adjusting the thickness, or the like. Material examples (2-1) to (2-3) will be explained below.

(2-1) A material obtained by adding an impurity to an alloy containing at least one of iron (Fe), cobalt (Co), and nickel (Ni), and at least one of chromium (Cr), platinum (Pt), and palladium (Pd).

An example of an ordered alloy is a material whose magnetic anisotropic energy density is decreased by adding an impurity such as copper (Cu), chromium (Cr), or silver (Ag) to $Fe_{50}Pt_{50}$, $Fe_{50}Pd_{50}$, or $CO_{50}Pt_{50}$. An example of a random alloy is a material whose magnetic anisotropic energy density is decreased by increasing the ratio of a nonmagnetic element in a CoCr alloy, CoPt alloy, CoCrPt alloy, CoCrPtTa alloy, or CoCrNb alloy.

(2-2) A material which has a structure obtained by alternately stacking at least one of iron (Fe), cobalt (Co), and nickel (Ni) or an alloy containing one of these elements, and one of platinum (Pt) and palladium (Pd) or an alloy containing one of these elements, and in which the thickness of the layer consisting of the former element or alloy or the thickness of the layer consisting of the latter element or alloy is adjusted.

The thickness of the layer consisting of at least one of iron (Fe), cobalt (Co), and nickel (Ni) or the alloy containing one of these elements has an optimum value, and the thickness of the layer consisting of one of platinum (Pt) and palladium (Pd) or the alloy containing one of these elements has an optimum value. As the thicknesses deviate from these optimum values, the magnetic anisotropic energy density gradually decreases.

(2-3) A material obtained by adjusting the composition ratio of an amorphous alloy containing at least one rare-earth metal, e.g., terbium (Tb), dysprosium (Dy), or gadolinium (Gd), and at least one transition metal.

An example is a material whose magnetic anisotropic energy density is decreased by adjusting the composition ratio of an amorphous alloy such as a TbFe alloy, TbCo alloy, TbFeCo alloy, DyTbFeCo alloy, or GdTbCo alloy.

The antiferromagnetic layer for fixing the direction of magnetization of the fixed layer 14 is made of an alloy containing manganese (Mn) and one of iron (Fe), nickel (Ni), platinum (Pt), palladium (Pd), ruthenium (Ru), osmium (Os), and iridium (Ir). Examples are an FeMn alloy, NiMn alloy, PtMn alloy, PtPdMn alloy, RuMn alloy, OsMn alloy, and IrMn alloy.

The tunnel barrier layer 13 is made of an insulating material such as magnesium oxide (MgO) or aluminum oxide ($Al_2O_3$). The lower electrode 11 and upper electrode 15 are made of a metal such as tantalum (Ta) or titanium nitride (TiN).

The MTJ element 10 includes two protective films 16 and 17 so as to cover the stacked structure obtained by sequentially stacking the lower electrode 11, recording layer 12, tunnel barrier layer 13, fixed layer 14, and upper electrode 15. In other words, the two protective films 16 and 17 are formed to surround at least the circumferential surface of the stacked structure. The protective film 16 is formed to cover the stacked structure, and the protective film 17 is formed to cover the protective film 16. The protective films 16 and 17 are made of silicon nitride (SiN).

A silicon nitride film can be deposited by chemical vapor deposition (CVD) as a chemical deposition method, or physical vapor deposition (PVD) as a physical deposition method. When depositing a silicon nitride film by PVD, vapor deposition of SiN is performed. Examples are deposition performed by sticking the material to a substrate by heating and evaporation, and sputtering performed by sticking sputtering particles of the material to a substrate. A silicon nitride film deposited by PVD will be referred to as PVD-SiN hereinafter.

On the other hand, silicon nitride film deposition using CVD is performed by using a gaseous mixture of a silicon compound and nitrogen ($N_2$). Examples of the gaseous silicon compound are monosilane ($SiH_4$), disilane ($SiH_6$), dichlorosilane ($SiH_2Cl_2$), disilazane ($H_3SiNHSiH_3$), polysilazane ($SiH_2NH$), and hexamethyldisilazane (HMDS [$(CH_3)_3SiNHSi(CH_3)_3$]). A silicon nitride film deposited by CVD will be referred to as CVD-SiN hereinafter.

When using CVD-SiN as the protective film, the function of blocking oxygen and water is high because the covering properties are high, but processing damage may be inflicted on the MTJ. More specifically, hydrogen contained in the gaseous silicon compound reacts with oxygen in native oxide films formed on the lower electrode 11, MTJ, and upper electrode 15, thereby producing water. The magnetic characteristics of the recording layer 12 and fixed layer 14 degrade under the influence of this water. Also, hydrogen contained in the gaseous silicon compound reduces MgO (or $Al_2O_3$) as the tunnel barrier layer 13. This changes the film thickness of the tunnel barrier layer 13 and degrades its characteristics.

In contrast, when using PVD-SiN as the protective film, neither the influence of water nor the reduction reaction of MgO occurs, but the function of blocking oxygen and water in thin portions degrades because the covering properties are low.

In the MTJ element 10 according to the first embodiment, therefore, PVD-SiN is used as the protective film 16 in contact with the MTJ, and CVD-SiN is used as the outside protective film 17. This makes it possible to improve the covering properties and the function of blocking oxygen and water by CVD-SiN while suppressing damage to the MTJ by PVD-SiN.

When using CVD-SiN, the reaction of the gaseous silicon compound increases the content of hydrogen in the film; the hydrogen content is about 6 at % (atomic %) or more. For CVD-SiN to achieve the functions as the protective film while maintaining the properties of a silicon nitride film, the upper limit of the hydrogen content in CVD-SiN is about 20 at % or less. In contrast, the hydrogen content in PVD-SiN is 4 at % or less (including zero) because no hydrogen is used during deposition.

(Manufacturing Method)

Next, an example of a method of manufacturing an MRAM including the MTJ element 10 according to the first embodiment will be explained with reference to the accompanying drawing. Note that this embodiment will be explained by taking an MRAM including a 1Tr+1MTJ memory cell formed by connecting one MTJ element 10 and one selection transistor 22 in series as an example.

A p-type substrate 20 is, e.g., a p-type semiconductor substrate, a semiconductor substrate having a p-type well, or a silicon on insulator (SOI) substrate having a p-type semiconductor layer. The semiconductor substrate 20 is made of, e.g., silicon (Si).

The semiconductor substrate 20 includes element isolation insulating layers 21 in the surface region, and the surface region of the semiconductor substrate 20 where the element isolation insulating layers 21 are not formed functions as an element region (active region). The element isolation insulating layers 21 are formed by, e.g., shallow trench isolation (STI). The STIs 21 are made of, e.g., silicon oxide ($SiO_2$).

As shown in FIG. 2, the selection transistor 22 such as an n-channel MOS transistor is formed on the semiconductor substrate 20. The selection transistor 22 includes a source region 23A and drain region 23B formed apart from each other in the semiconductor substrate 20, and a gate electrode 25 formed on a gate insulating film 24 on the semiconductor substrate 20 between the source region 23A and drain region 23B. Each of the source region 23A and drain region 23B is an n$^+$-type diffusion region formed by heavily doping an n$^+$-type impurity (e.g., phosphorus [P] or arsenic [As]) in the semiconductor substrate 20. The gate electrode 25 functions as a word line. The source region 23A is connected to a source line (not shown) via a contact. An electric current is supplied to the MTJ element 10 through this source line.

Then, an interlayer dielectric layer 26 made of silicon oxide ($SiO_2$) or the like is deposited on the semiconductor substrate 20 so as to cover the selection transistor 22. Subsequently, an opening that exposes the drain region 23B is formed in the interlayer dielectric layer 26, and a conductor made of tungsten (W) is buried in this opening. The upper surfaces of the interlayer dielectric layer 26 and conductor are planarized by chemical mechanical polishing (CMP). Consequently, a contact 27 electrically connected to the drain region 23B is formed in the interlayer dielectric layer 26.

As shown in FIG. 3, a lower electrode 11, MTJ, and upper electrode 15 are sequentially formed by, e.g., sputtering. The lower electrode 11, MTJ, and upper electrode 15 are made of any of the above-mentioned materials. As shown in FIG. 4, the upper electrode (hard mask layer) 15 is processed into the same shape as the planar shape of the MTJ element 10 by lithography and reactive ion etching (RIE).

As shown in FIG. 5, the hard mask layer 15 is used as a mask to etch the MTJ film by, e.g., ion milling, thereby forming an MTJ having a desired planar shape.

Figure 6:
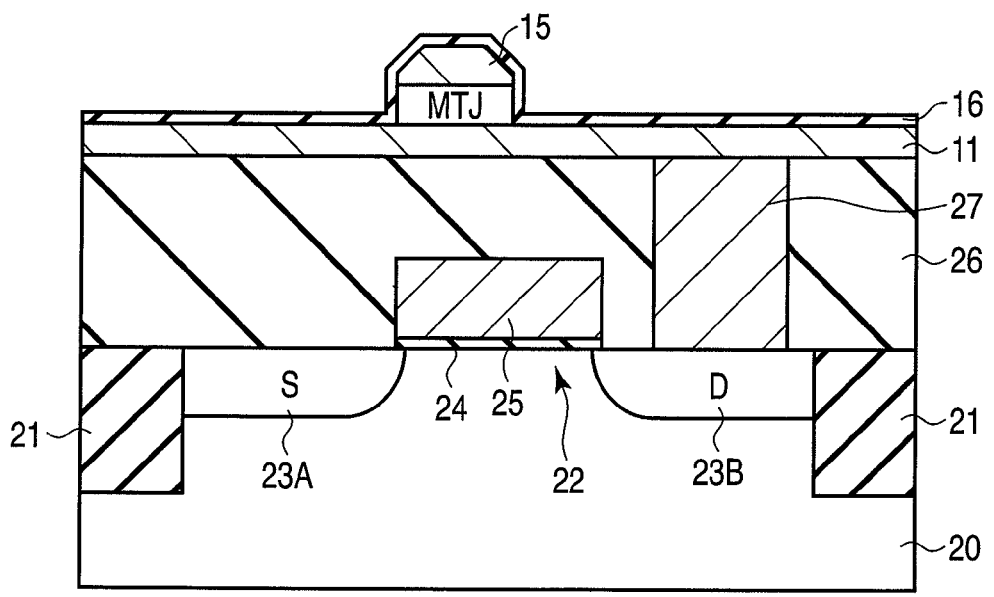
FIG. 6 is a sectional view showing a step, which follows FIG. 5, of the MRAM manufacturing method.

As shown in FIG. 6, a protective film 16 made of silicon nitride is deposited on the upper electrode 15 and lower electrode 11 by PVD so as to cover the MTJ and upper electrode 15. Since no hydrogen is used in a deposition step performed by PVD, degradation of the magnetic characteristics of the MTJ can be suppressed.

Figure 7:
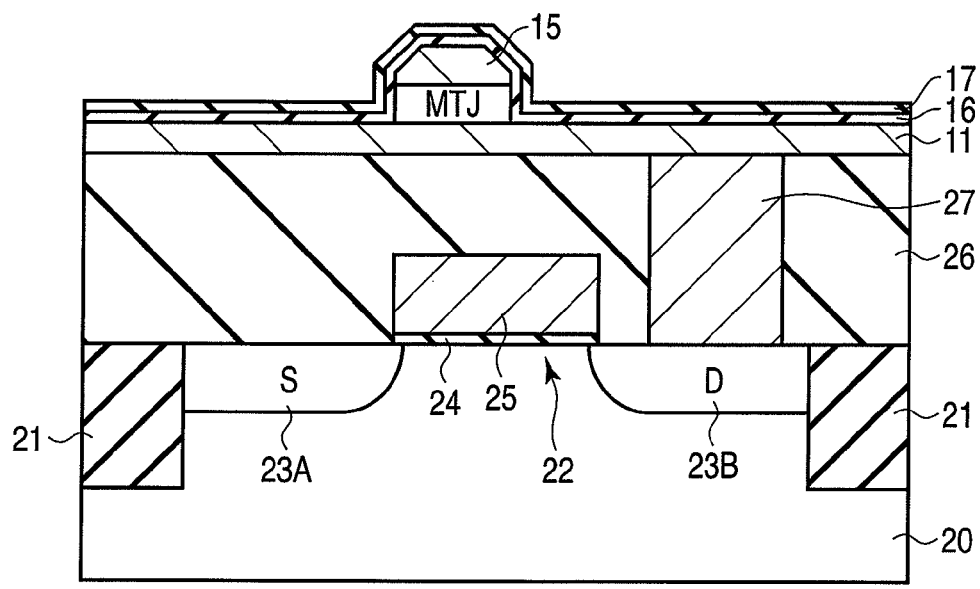
FIG. 7 is a sectional view showing a step, which follows FIG. 6, of the MRAM manufacturing method.

As shown in FIG. 7, a protective film 17 made of silicon nitride is deposited on the protective film 16 by CVD. Since the protective film 17 formed by CVD have high covering properties, it is possible to block the entrance of oxygen and water into the MTJ. Consequently, oxidation of the MTJ can be suppressed. It is also possible to suppress degradation of the magnetic characteristics caused by the entrance of water into the MTJ.

Figure 8:
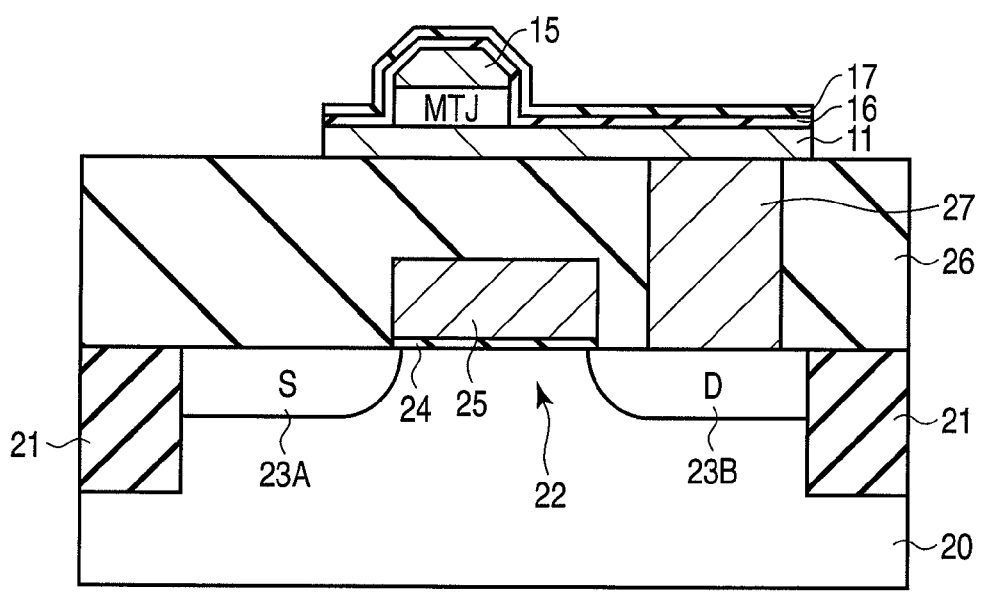
FIG. 8 is a sectional view showing a step, which follows FIG. 7, of the MRAM manufacturing method.

As shown in FIG. 8, the lower electrode 11 is processed into a desired shape by lithography and RIE. Note that in this step of processing the lower electrode 11, the protective films 16 and 17 are also processed into the same planar shape as that of the lower electrode 11. As shown in FIG. 9, an interlayer dielectric layer 28 made of, e.g., silicon oxide is deposited on the interlayer dielectric layer 26 so as to cover the protective film 17. Subsequently, CMP is used to planarize the upper surface of the interlayer dielectric layer 28 and remove the protective films 16 and 17 formed on the upper surface of the hard mask layer 15, thereby exposing the upper surface of the hard mask layer 15.

As shown in FIG. 10, a conductor made of, e.g., aluminum (Al) is deposited on the hard mask layer 15 and interlayer dielectric layer 28, and processed by lithography and RIE. Consequently, an interconnection layer (bit line) 29 electrically connected to the hard mask layer 15 is formed. In this manner, the MRAM according to the first embodiment is manufactured.

In the first embodiment as described in detail above, the two protective films 16 and 17 are formed to cover the stacked structure obtained by sequentially stacking the lower electrode 11, recording layer 12, tunnel barrier layer 13, fixed layer 14, and upper electrode 15. The two protective films 16 and 17 made of silicon nitride. Additionally, the protective film 16 in contact with the stacked structure is deposited using PVD, and the outside protective film 17 is deposited using CVD.

In the first embodiment, therefore, the stacked structure including the MTJ is covered with the two protective films, so oxidation of the MTJ can be suppressed. This makes it possible to suppress degradation of the magnetic characteristics of the MTJ.

Also, the hydrogen content is low in the protective film (PVD-SiN) 16 in contact with the MTJ. Therefore, the production of water and the reduction reaction of the tunnel barrier layer 13 can be suppressed. This makes it possible to suppress degradation of the magnetic characteristics of the recording layer 12 and fixed layer 14. Furthermore, degradation of the characteristics of the tunnel barrier layer 13 can be suppressed. Consequently, it is possible to improve the retention characteristic of the MTJ element 10, and prevent a read error occurring when the binary digit stored in the MTJ element 10 is destroyed.

In addition, the protective film 17 formed outside the protective film 16 by using CVD-SiN can block oxygen and water because the covering properties are high. This makes it possible to protect the magnetic characteristics of the recording layer 12 and fixed layer 14 from being degraded by oxygen and water, and suppress degradation of the characteristics of the tunnel barrier layer 13 as well.

Second Embodiment

In the second embodiment, two protective films 16 and 17 are formed to cover an MTJ. The two protective films 16 and 17 are made of aluminum oxide, the protective film 16 in contact with the MTJ is deposited using PVD, and the outside protective film 17 is deposited using CVD.

FIG. 11 is a sectional view showing the arrangement of an MTJ element 10 according to the second embodiment of the present invention. The MTJ element 10 includes the two protective films 16 and 17 so as to cover a stacked structure obtained by sequentially stacking a lower electrode 11, recording layer 12, tunnel barrier layer 13, fixed layer 14, and upper electrode 15. In other words, the two protective films 16 and 17 are formed to surround at least the circumferential surface of the stacked structure. The protective film 16 is formed to cover the stacked structure, and the protective film 17 is formed to cover the protective film 16. The protective films 16 and 17 made of aluminum oxide ($Al_2O_3$).

An aluminum oxide film can be deposited by CVD or PVD. An aluminum oxide film deposited by CVD will be referred to as $CVD-Al_2O_3$ hereinafter. An aluminum oxide film deposited by PVD will be referred to as $PVD-Al_2O_3$ hereinafter.

Aluminum oxide film deposition using CVD is performed by using, e.g., a gaseous mixture of an organic gas containing aluminum and hydrogen, and water vapor (or gaseous oxygen [$O_2$]). An example of the organic gas containing aluminum and hydrogen is trimethylaluminum (TMA).

When using $CVD-Al_2O_3$ as the protective film, the function of blocking oxygen and water is high because the covering properties are high, but processing damage may be inflicted to the MTJ. More specifically, hydrogen contained in the organic gas reacts with oxygen in native oxide films formed on the lower electrode 11, MTJ, and upper electrode 15, thereby producing water. The magnetic characteristics of the recording layer 12 and fixed layer 14 deteriorate under the influence of this water. Also, hydrogen contained in the organic gas reduces MgO as the tunnel barrier layer 13. This changes the film thickness of the tunnel barrier layer 13 and degrades its characteristics. Furthermore, oxygen contained in the gaseous mixture oxidizes the MTJ and degrades its characteristics.

In contrast, when using $PVD-Al_2O_3$ as the protective film, any of the oxidation, the influence of water, and the reduction reaction of MgO hardly occurs, but the function of blocking oxygen and water in thin portions degrades because the covering properties are poor.

In the MTJ element 10 according to the second embodiment, therefore, $PVD-Al_2O_3$ is used as the protective film 16 in contact with the MTJ, and $CVD-Al_2O_3$ is used as the outside protective film 17. This makes it possible to improve the covering properties and the function of blocking oxygen and water by $CVD-Al_2O_3$ while suppressing damage to the MTJ by $PVD-Al_2O_3$.

When using $CVD-Al_2O_3$, the reaction of the organic gas increases the content of hydrogen in the film; the hydrogen content is about 6 at % or more. For $CVD-Al_2O_3$ to achieve the functions as the protective film while maintaining the properties of an aluminum oxide film, the upper limit of the hydrogen content in $CVD-Al_2O_3$ is about 20 at % or less. In contrast, the hydrogen content in $PVD-Al_2O_3$ is 4 at % or less (including zero) because no hydrogen is used during deposition.

A method of manufacturing an MRAM including the MTJ element 10 according to the second embodiment is the same as the manufacturing method explained in the first embodiment, except that the material of the protective films 16 and 17 is changed from SiN to $Al_2O_3$.

In the second embodiment as described in detail above, degradation of the magnetic characteristics of the MTJ can be suppressed as in the first embodiment. Consequently, it is possible to improve the retention characteristic of the MTJ element 10, and prevent a read error occurring when the binary digit stored in the MTJ element 10 is destroyed.

Third Embodiment

In the third embodiment, two protective films 16 and 17 are formed to cover an MTJ. One of the two protective films 16 and 17 is made of silicon nitride, and the other is made of aluminum oxide. In addition, the protective film 16 in contact with the MTJ is deposited using PVD, and the outside protective film 17 is deposited using CVD.

FIG. 12 is a sectional view showing the arrangement of an MTJ element 10 according to the third embodiment of the present invention. The MTJ element 10 includes the two protective films 16 and 17 so as to cover a stacked structure obtained by sequentially stacking a lower electrode 11, recording layer 12, tunnel barrier layer 13, fixed layer 14, and upper electrode 15. In other words, the two protective films 16 and 17 are formed to surround at least the circumferential surface of the stacked structure. The protective film 16 is made of silicon nitride, and the protective film 17 is made of aluminum oxide.

A silicon nitride film has a high function of blocking oxygen and water. On the other hand, an aluminum oxide film has a high function of blocking hydrogen. Therefore, the functions of blocking hydrogen, oxygen, and water can be improved by forming one of the two protective films by a silicon nitride film, and the other by an aluminum oxide film.

Furthermore, a silicon nitride film (PVD-SiN) formed by PVD is used as the protective film 16 in contact with the MTJ. This makes it possible to suppress degradation of the magnetic characteristics of the recording layer 12 and fixed layer 14 caused by the influence of water. In addition, the reduction reaction of MgO as the tunnel barrier layer 13 can be suppressed.

Also, an aluminum oxide film (CVD-$Al_2O_3$) formed by CVD is used as the outside protective film 17. Since this improves the MTJ covering properties, the function of blocking oxygen and water can be improved.

When using CVD-$Al_2O_3$, the reaction of an organic gas increases the content of hydrogen in the film; the hydrogen content is about 6 (inclusive) to 20 (inclusive) at %. In contrast, the hydrogen content in PVD-SiN is 4 at % or less (including zero) because no hydrogen is used during deposition.

FIG. 13 is a sectional view showing another example of the arrangement of the MTJ element 10 according to the third embodiment. As shown in FIG. 13, an aluminum oxide film (PVD-$Al_2O_3$) formed by PVD is used as the protective film 16 in contact with the MTJ. On the other hand, a silicon nitride film (CVD-SiN) formed by CVD is used as the outside protective film 17. When using CVD-SiN, the reaction of a gaseous silicon compound increases the content of hydrogen in the film; the hydrogen content is about 6 (inclusive) to 20 (inclusive) at %. In contrast, the hydrogen content in PVD-$Al_2O_3$ is 4 at % or less (including zero) because no hydrogen is used during deposition. The same effects as those of the arrangement shown in FIG. 12 can be obtained in this arrangement as well.

A method of manufacturing an MRAM including the MTJ element 10 according to the third embodiment is the same as the manufacturing method explained in the first embodiment, except that the material of the protective films 16 and 17 is changed.

In the third embodiment as described in detail above, degradation of the magnetic characteristics of the MTJ can be suppressed as in the first embodiment. Consequently, it is possible to improve the retention characteristic of the MTJ element 10, and prevent a read error occurring when the binary digit stored in the MTJ element 10 is destroyed.

Note that the first to third embodiments have been explained by taking a single-junction MTJ element in which one fixed layer and one recording layer sandwich a tunnel barrier layer as an example. However, the present invention is not limited to this arrangement, and can also be applied to a double-junction MTJ element in which two fixed layers are formed above and below a recording layer with nonmagnetic layers being interposed between them.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
    a stacked structure comprising a fixed layer comprising a fixed direction of magnetization, a recording layer comprising a varied direction of magnetization, and a nonmagnetic layer between the fixed layer and the recording layer;
    a first protective film over a circumferential surface of the stacked structure, comprising silicon nitride; and
    a second protective film over a circumferential surface of the first protective film, comprising silicon nitride,
    wherein a hydrogen content in the first protective film is not more than 4 at %, and
    a hydrogen content in the second protective film is not less than 6 at %.

2. The element of claim 1, wherein
    the first protective film is formed by Physical Vapor Deposition (PVD), and the second protective film is formed by Chemical Vapor Deposition (CVD).

3. The element of claim 1, wherein the hydrogen content in the second protective film is not more than 20 at %.

4. The element of claim 1, further comprising an interlayer dielectric film around the second protective film.

5. The element of claim 4, wherein the interlayer dielectric film comprises silicon oxide.

* * * * *